US008198921B2

(12) United States Patent
Chen et al.

(10) Patent No.: US 8,198,921 B2
(45) Date of Patent: Jun. 12, 2012

(54) DYNAMIC COMPARATOR WITH BACKGROUND OFFSET CALIBRATION

(75) Inventors: Bo-Wei Chen, Miaoli County (TW); Tim-Kuei Shia, Taichung County (TW); Ji-Eun Jang, Junnam-Province (KR)

(73) Assignee: Industrial Technology Research Institute, Hsinchu (TW)

( * ) Notice: Subject to any disclaimer, the term of this patent is extended or adjusted under 35 U.S.C. 154(b) by 340 days.

(21) Appl. No.: 12/640,016

(22) Filed: Dec. 17, 2009

(65) Prior Publication Data
US 2011/0109348 A1    May 12, 2011

(30) Foreign Application Priority Data
Nov. 9, 2009   (TW) .............................. 98137934 A

(51) Int. Cl.
*H03K 5/22*    (2006.01)
(52) U.S. Cl. ................. 327/65; 327/55; 327/56; 327/64
(58) Field of Classification Search .................. 327/52, 327/54–57, 63–65, 67, 307; 365/205, 207
See application file for complete search history.

(56) References Cited

U.S. PATENT DOCUMENTS

| | | | |
|---|---|---|---|
| 6,320,426 | B1 | 11/2001 | Shih |
| 7,196,552 | B2 * | 3/2007 | Zhou ............................... 327/65 |
| 7,405,682 | B2 | 7/2008 | Ebner et al. |
| 2008/0143577 | A1 * | 6/2008 | Tomisawa et al. ............. 341/165 |

OTHER PUBLICATIONS

T. Kobayashi, "A current-controlled latch sense amplifier and a static power-saving input buffer for low-power architecture" IEEE IEICE Trans. Electron., vol. E76-C, No. 5, May 1993, pp. 863-867.

B.Razavi et al., "Design techniques for high-speed, high-resolution comparators," IEEE JSSC, vol. 27, No. 12, Dec. 1992, pp. 1916-1926.
Van Der Plas et al., "A 0.16pJ/Conversion-Step 2.5mW 1.25GS/s 4b ADC in a 90nm Digital CMOS Process," IEEE ISSCC 2006/ Session 31 / Very High-Speed ADCs and DACs / 31.1.
H. Okada et al., "Offset calibrating comparator array for 1.2-V, 6-bit, 4-Gsample/s flash ADCs using 0.13um generic CMOS technology," 2003 at IEEE ESSCIRC.
Chen et al., "A Low Power 6-bit Flash ADC with Reference Voltage and Common-Mode Calibration," 2008 IEEE Symposium on VLSI Circuits Digest of Technical Papers, pp. 12-13.
Lien et al., "A 6-b 1-GS/s 30-mW ADC in 90-nm CMOS Technology," IEEE Asian Solid-State Circuits Conference, Nov. 3-5, 2008, pp. 45-48.
P. M. Figueiredo et al., "A 90nm CMOS 1.2V 6b 1GS/s Two-Step Subranging ADC," IEEE ISSCC 2006 / Session 31 / Very High-Speed ADCs and DACs / 31.2.

* cited by examiner

*Primary Examiner* — Long Nguyen
(74) *Attorney, Agent, or Firm* — Jianq Chyun IP Office

(57) ABSTRACT

A dynamic comparator with background offset calibration is provided. The dynamic comparator includes at least one input differential pair, a first back-to-back inverter, a second back-to-back inverter, and an integrator. The input differential pair includes two current branches, wherein one of the current branches has an input referred offset. The first back-to-back inverter determines which one of the two current branches has the input referred offset in response to a first clock signal and generates two control signals accordingly. The integrator generates two calibration voltages for the input differential pair in response to the two control signals, so as to calibrate the input referred offset. The second back-to-back inverter determines a difference between two input signals received by the input differential pair after the input referred offset is calibrated in response to a second clock signal and outputs two comparison signals accordingly.

16 Claims, 6 Drawing Sheets

DYNAMIC COMPARATOR WITH BACKGROUND OFFSET CALIBRATION

CROSS-REFERENCE TO RELATED APPLICATION

This application claims the priority benefit of Taiwan application serial no. 98137934, filed on Nov. 9, 2009. The entirety of the above-mentioned patent application is hereby incorporated by reference herein and made a part of specification.

BACKGROUND OF THE INVENTION

1. Technical Field

The present invention generally relates to a comparator, and more particularly, to a dynamic comparator with background offset calibration.

2. Background

Comparator based analog-to-digital converters (ADCs), such as successive approximation registers (SARs), flash ADCs, folding ADCs, and sub-ranging ADCs, has always been the focus of ADC research. A comparator based ADC requires no operational amplifier (OPAMP), and therefore offers relatively high integrity, especially when it is applied in a deep-submicron fabrication process (<0.13 um).

In addition, the comparators in many high-speed (>GSample/second (GS/s in short)) ADCs adopt a dynamic structure so that quiescent current consumption is avoided. Moreover, the power consumption of a comparator based ADC can be greatly reduced, and accordingly, the design of OPAMP based pipelined ADC has been converted into comparator based ADC in recent years. Thereby, comparator based ADC has become one of the major techniques developed in related fields, and how to make a comparator based ADC have a high speed, (>GS/s), a low power consumption, and a medium/high resolution ($\geqq$8 bits) has become a major subject in the related fields.

Many comparator structures that offer high speed and low power consumption have been developed. The most representative one among foregoing structures is disclosed in the article titled "A current controlled latch sense amplifier and a static power-saving input buffer for low-power architecture" published by Kobayashi in 1993 (IEEE JSSC). The most representative comparator structure that offers a medium/high resolution is disclosed in the article titled "Design techniques for high-speed, high-resolution comparators" published by Razavi in 1992 (IEEE JSSC).

Researches done after year 2000 show that the dynamic comparator structure provided by Kobayashi can fulfil the requirements of both high speed and low power consumption if the sampling frequency of the comparator based ADC is set to be greater than GS/s. Thus, this structure has become the most commonly adopted comparator structure. However, no comparator structure that can meet all the requirements of medium/high resolution, high speed, and low power consumption is developed yet. The difficulty lies in that to fulfil the requirement of medium/high resolution, the input referred offset (also referred to as the offset voltage) produced by the comparator due to process mismatch has to be cancelled or calibrated to achieve a desired resolution. In existing offset calibration techniques, at least one preamplifier and/or one sampling capacitor have to be disposed on the input signal path of a comparator. However, since there is quiescent current consumption in the preamplifier, the signal bandwidth is affected and accordingly the surface area of the chip is increased.

In order to remove the preamplifier and/or sampling capacitor on the signal path, a technique is disclosed in the article titled "A 0.16 pJ/Conversion-Step 2.5 mW 1.25 GS/s 4b ADC in a 90 nm Digital CMOS Process" published by Van der Plas in 2006 (IEEE ISSCC). According to this article, an offset voltage is first generated by using an imbalanced input pair and served as a reference voltage (i.e., coarse adjustment). Then, foreground offset calibration is performed on the offset voltage based on a concept of imbalanced output capacitor array, so as to obtain a desired reference voltage (i.e., fine adjustment).

Accordingly, in a fully differential application of the ADC disclosed by Van der Plas, the number of input pairs can be reduced from two to one since the reference voltage is built in the ADC. However, the disadvantages of the ADC disclosed by Van der Plas are that the coarse adjustment performed on the offset voltage is very sensitive to any process variation and the signal can only be adjusted within a very limited range. Besides, to achieve a higher resolution (>4 bits), the resolution of an output capacitor array for offset calibration has to be increased.

In addition, two comparator-related offset calibration techniques are disclosed in U.S. Pat. Nos. 7,405,682 and 6,320,426. Moreover, more comparator-related offset calibration techniques are disclosed in the article titled "Offset calibrating comparator array for 1.2-V, Gbit, 4-GSPs flash ADCs using 0.13 um generic CMOS technology" published by Hiroyuki Okada in 2003 at IEEE ESSCIRC, the article titled "A Low Power 6-bit Flash ADC with Reference Voltage and Common-Mode Calibration" published by Chun-Ying Chen in 2008 at the conference of IEEE Symposium on VLSI Circuits, the article titled "A 6-b 1-GSPs 30-mW ADC in 90-nm CMOS Technology" published by Yuan-Ching Lien in 2008 at IEEE A-SSCC, and the article titled "A 90 nm CMOS 1.2 V 6b 1 GS/s Two-Step Sub-ranging ADC" published by Pedro M. Figueiredo in 2006 at IEEE ISSCC.

SUMMARY

According to an embodiment of the present disclosure, a dynamic comparator with background offset calibration is provided. The dynamic comparator includes an input differential pair, a first back-to-back inverter, a second back-to-back inverter, and an integrator. The input differential pair includes two current branches, wherein one of the two current branches has an input referred offset. The first back-to-back inverter is coupled to the input differential pair, and which determines which one of the two current branches has the input referred offset in response to a first clock signal and generates two control signals accordingly. The integrator is coupled to the first back-to-back inverter, and which generates two calibration voltages for the input differential pair in response to the two control signals, so as to calibrate the input referred offset. The second back-to-back inverter is coupled to the input differential pair, and which determines the difference between two input signals received by the input differential pair after the input referred offset is calibrated in response to the second clock signal and outputs two comparison signals.

According to another embodiment of the present disclosure, a dynamic comparator with background offset calibration is provided. The dynamic comparator includes a first input differential pair, a second input differential pair, a first back-to-back inverter, a second back-to-back inverter, and an integrator. The first input differential pair includes two first current branches, wherein one of the two first current branches has a first input referred offset. The second input differential pair includes two second current branches, wherein one of the two second current branches has a second input referred offset. The first back-to-back inverter is coupled to the first input differential pair and the second input differential pair. The first back-to-back inverter determines which one of the two first current branches has the first input referred offset in response to a first clock signal and a second clock signal and generates two control signals accordingly. The first back-to-back inverter also determines which one of the two second current branches has the second input referred offset in response to the first clock signal and a third clock signal and generates another two control signals accordingly. The integrator is coupled to the first back-to-back inverter. The integrator generates two calibration voltages for the first input differential pair in response to the two control signals, so as to calibrate the first input referred offset. The integrator also generates another two calibration voltages for the second input differential pair in response to the another two control signals, so as to calibrate the second input referred offset. The second back-to-back inverter is coupled to the first input differential pair and the second input differential pair, and which determines the difference between four input signals received by the first input differential pair and the second input differential pair after the first input referred offset and the second input referred offset are calibrated in response to the second clock signal, the third clock signal, and a fourth clock signal and outputs two comparison signals accordingly.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
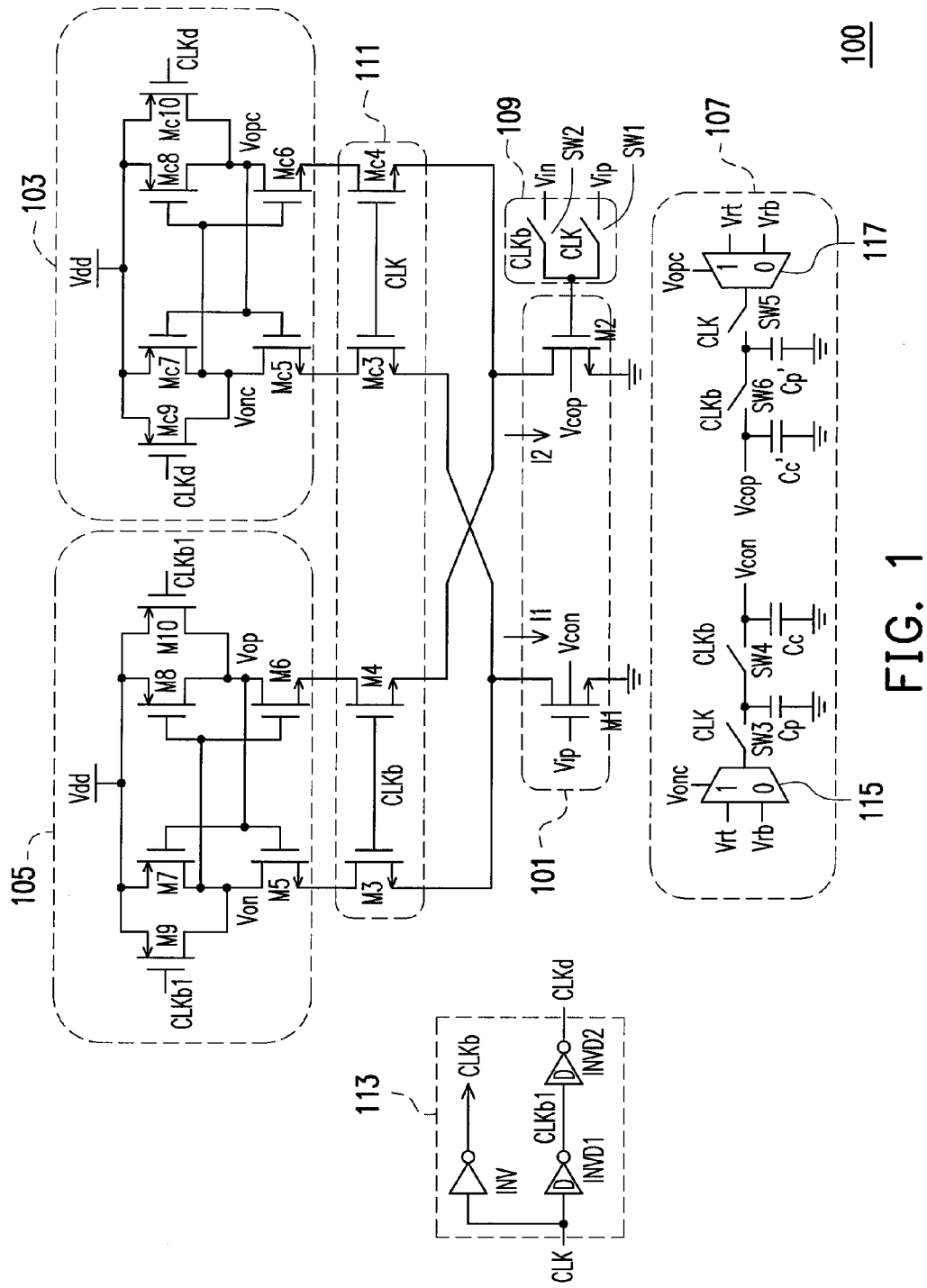
FIG. 1 is a block diagram of a dynamic comparator with background offset calibration according to a first embodiment.

Reference will now be made in detail to the present preferred embodiments of the invention, examples of which are illustrated in the accompanying drawings. Wherever possible, the same reference numbers are used in the drawings and the description to refer to the same or like parts.

A dynamic comparator with background offset calibration is provided in embodiments of the present disclosure, wherein a preamplifier is removed from the signal path so that both a high speed and a low power consumption can be achieved. In addition, according to the present disclosure, the background offset calibration mechanism coming with the dynamic comparator does not increase the surface area of the dynamic comparator. Thereby, a medium/high resolution is also achieved.

[First Embodiment]

FIG. 1 is a block diagram of a dynamic comparator with background offset calibration according to a first embodiment of the present disclosure. Referring to FIG. 1, the dynamic comparator 100 includes an input differential pair 101, two back-to-back inverters 103 and 105, an integrator 107, a multiplexer 109, a de-multiplexer 111, and a clock generator 113. The input differential pair 101 includes two current branches I1 and I2, wherein one of the two current branches I1 and I2 has an input referred offset, and the input referred offset is caused by process mismatch in the dynamic comparator 100.

The back-to-back inverter 103 is coupled to the input differential pair 101. The back-to-back inverter 103 determines which one of the two current branches I1 and I2 has the input referred offset in response to a clock signal CLKd and generates two control signals Vonc and Vopc accordingly. The integrator 107 is coupled to the back-to-back inverter 103 and generates two calibration voltages Vcon and Vcop for the input differential pair 101 in response to the two control signals Vonc and Vopc, so as to calibrate the input referred offset. The back-to-back inverter 105 is coupled to the input differential pair 101, and the back-to-back inverter 105 determines the difference between two input signals Vip and Vin received by the input differential pair 101 after the input referred offset is calibrated in response to a clock signal CLKb1 and outputs two comparison signals Von and Vop accordingly.

The multiplexer 109 is coupled to the input differential pair 101, and the multiplexer 109 receives the two input signals Vip and Vin and outputs one of the two input signals Vip and Vin in response to a clock signal CLK. The multiplexer 109 includes two switches SW1 and SW2. The first terminal of the switch SW1 receives the input signal Vip, and the control terminal of the switch SW1 receives the clock signal CLK. The first terminal of the switch SW2 receives the input signal Vin, and the control terminal of the switch SW2 receives a clock signal CLKb.

Figure 2:
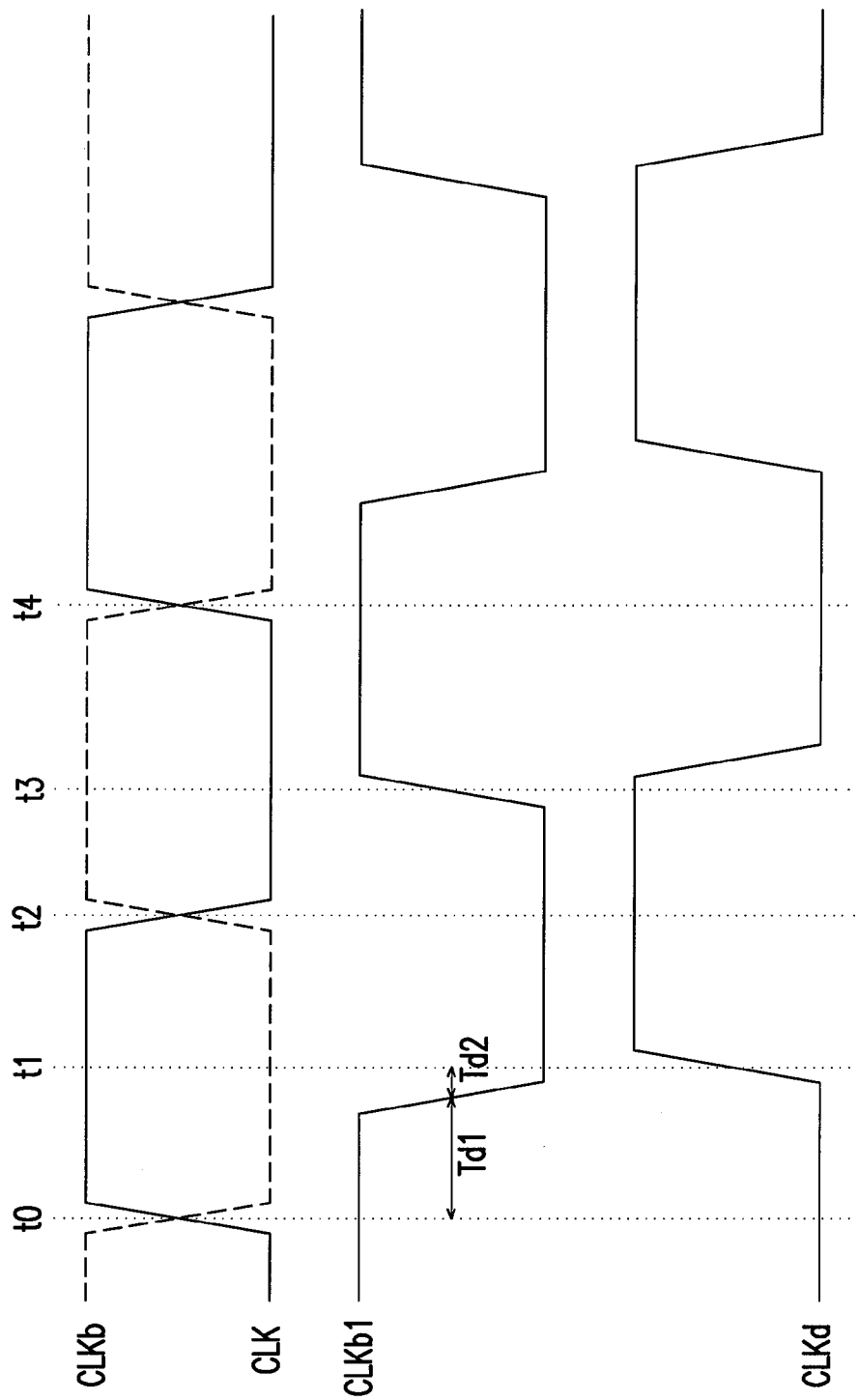
FIG. 2 is an operation timing diagram of the dynamic comparator in FIG. 1.

In the present embodiment, the clock signals CLKd, CLKb1, and CLKb are generated by the clock generator 113 after the clock generator 113 receives the clock signal CLK, and the relationship between the clock signals CLKd, CLKb1, CLK, and CLKb is illustrated in FIG. 2. The clock generator 113 includes an inverter INV and two delay inverters INVD1 and INVD2. The input terminal of the inverter INV receives the clock signal CLK, and the output terminal of the inverter INV outputs the clock signal CLKb. The input terminal of the delay inverter INVD1 receives the clock signal CLK, and the output terminal of the delay inverter INVD1 outputs the clock signal CLKb1. The input terminal of the delay inverter INVD2 receives the clock signal CLKb1, and the output terminal of the delay inverter INVD2 outputs the clock signal CLKd.

As shown in FIG. 2, the phase difference between the clock signal CLK and the clock signal CLKb is 180° (i.e., the clock signal CLK and the clock signal CLKb are reverse to each other), a delay time Td1 exists between the clock signal CLKb1 and the clock signal CLK, and a delay time Td2 exists between the clock signal CLKb 1 and the clock signal CLKd.

The input differential pair 101 includes two NMOS transistors M1 and M2. The gate of the NMOS transistor M1 receives the input signal Vip, the bulk of the NMOS transistor M1 receives a calibration voltage Vcon, and the source of the NMOS transistor M1 is coupled to the ground. The gate of the NMOS transistor M2 is coupled to the second terminals of the switches SW1 and SW2, the bulk of the NMOS transistor M2 receives a calibration voltage Vcop, and the source of the NMOS transistor M2 is coupled to the ground.

The de-multiplexer 111 is coupled to the input differential pair 101 and the back-to-back inverters 103 and 105. The de-multiplexer 111 receives the drain currents (i.e., the current branches I1 and I2) of the NMOS transistors M1 and M2 and outputs the drain currents to the back-to-back inverter 103 or 105 in response to the clock signal CLK. In the first embodiment, the de-multiplexer 111 includes NMOS transistors M3, M4, Mc3, and Mc4. The gate of the NMOS transistor M3 receives the clock signal CLKb, and the source of the NMOS transistor M3 is coupled to the drain of the NMOS transistor M1. The gate of the NMOS transistor M4 receives the clock signal CLKb, and the source of the NMOS transistor M4 is coupled to the drain of the NMOS transistor M2. The gate of the NMOS transistor Mc3 receives the clock signal CLK, and the source of the NMOS transistor Mc3 is coupled to the drain of the NMOS transistor M1. The gate of the NMOS transistor Mc4 receives the clock signal CLK, and the source of the NMOS transistor Mc4 is coupled to the drain of the NMOS transistor M2.

The back-to-back inverter 103 includes NMOS transistors Mc5 and Mc6 and PMOS transistors Mc7~Mc10. The source of the NMOS transistor Mc5 is coupled to the drain of the NMOS transistor Mc3, and the drain of the NMOS transistor Mc5 outputs the control signal Vonc. The source of the NMOS transistor Mc6 is coupled to the drain of the NMOS transistor Mc4, and the drain of the NMOS transistor Mc6 outputs the control signal Vopc. The gate of the PMOS transistor Mc7 is coupled to the gate of the NMOS transistor Mc5 and the drain of the NMOS transistor Mc6, the source of the PMOS transistor Mc7 receives a system voltage Vdd, and the drain of the PMOS transistor Mc7 is coupled to the drain of the NMOS transistor Mc5.

The gate of the PMOS transistor Mc8 is coupled to the gate of the NMOS transistor Mc6 and the drain of the NMOS transistor Mc5, the source of the PMOS transistor Mc8 receives the system voltage Vdd, and the drain of the PMOS transistor Mc8 is coupled to the drain of the NMOS transistor Mc6. The gate of the PMOS transistor Mc9 receives the clock signal CLKd, the source of the PMOS transistor Mc9 receives the system voltage Vdd, and the drain of the PMOS transistor Mc9 is coupled to the drain of the NMOS transistor Mc5. The gate of the PMOS transistor Mc10 receives the clock signal CLKd, the source of the PMOS transistor Mc10 receives the system voltage Vdd, and the drain of the PMOS transistor Mc10 is coupled to the drain of the NMOS transistor Mc6.

The back-to-back inverter 105 includes NMOS transistors M5 and M6 and PMOS transistors M7~M10. The source of the NMOS transistor M5 is coupled to the drain of the NMOS transistor M3, and the drain of the NMOS transistor M5 outputs the comparison signal Von. The source of the NMOS transistor M6 is coupled to the drain of the NMOS transistor M4, and the drain of the NMOS transistor M6 outputs the comparison signal Vop. The gate of the PMOS transistor M7 is coupled to the gate of the NMOS transistor M5 and the drain of the NMOS transistor M6, the source of the PMOS transistor M7 receives the system voltage Vdd, and the drain of the PMOS transistor M7 is coupled to the drain of the NMOS transistor M5.

The gate of the PMOS transistor M8 is coupled to the gate of the NMOS transistor M6 and the drain of the NMOS transistor M5, the source of the PMOS transistor M8 receives the system voltage Vdd, and the drain of the PMOS transistor M8 is coupled to the drain of the NMOS transistor M6. The gate of the PMOS transistor M9 receives the clock signal CLKb1, the source of the PMOS transistor M9 receives the system voltage Vdd, and the drain of the PMOS transistor M9 is coupled to the drain of the NMOS transistor M5. The gate of the PMOS transistor M10 receives the clock signal CLKb1, the source of the PMOS transistor M10 receives the system voltage Vdd, and the drain of the PMOS transistor M10 is coupled to the drain of the NMOS transistor M6.

The integrator 107 includes multiplexers 115 and 117, switches SW3~SW6, and capacitors Cp, Cp', Cc, and Cc'. The multiplexer 115 receives two reference voltages Vrt and Vrb having different voltage levels and outputs one of the two reference voltages Vrt and Vrb in response to the control signal Vonc. The first terminal of the switch SW3 receives the output of the multiplexer 115, and the control terminal of the switch SW3 receives the clock signal CLK. The first terminal of the capacitor Cp is coupled to the second terminal of the switch SW3, and the second terminal of the capacitor Cp is coupled to the ground. The first terminal of the switch SW4 is coupled to the first terminal of the capacitor Cp, the control terminal of the switch SW4 receives the clock signal CLKb, and the second terminal of the switch SW4 outputs the calibration voltage Vcon. The first terminal of the capacitor Cc is coupled to the second terminal of the switch SW4, and the second terminal of the capacitor Cc is coupled to the ground.

The multiplexer 117 receives the two reference voltages Vrt and Vrb and outputs one of the two reference voltages Vrt and Vrb in response to the control signal Vopc. The first terminal of the switch SW5 receives the output of the multiplexer 117, and the control terminal of the switch SW5 receives the clock signal CLK. The first terminal of the capacitor Cp' is coupled to the second terminal of the switch SW5, and the second terminal of the capacitor Cp' is coupled to the ground. The first terminal of the switch SW6 is coupled to the first terminal of the capacitor Cp', the control terminal of the switch SW6 receives the clock signal CLKb, and the second terminal of the switch SW6 outputs the calibration voltage Vcop. The first terminal of the capacitor Cc' is coupled to the second terminal of the switch SW6, and the second terminal of the capacitor Cc' is coupled to the ground. In the present embodiment, the capacitors Cp and Cp' have the same capacitance, the capacitors Cc and Cc' have the same capacitance, and the capacitance of the capacitors Cc and Cc' is greater than the capacitance of the capacitors Cp and Cp'. However, the present invention is not limited thereto.

It can be understood by referring to FIG. 2 that each period of the clock signal CLK is divided into 4 time sections t0-t1, t1-t2, t2-t3, and t3-t4. Namely, an input referred offset comparison and an input differential signal comparison are expected to be performed during one period of the clock signal CLK. First, during the time section t0-t1, only the switches SW1, SW3, and SW5 are turned on, while the NMOS transistors M3 and M4 and the PMOS transistors Mc7, Mc8, M9, and M10 are turned off. Then, the control signals Vonc and Vopc are both pulled up to somewhere close to the system voltage Vdd, and the output of the back-to-back inverter 103 enters a metastable state.

Next, during the time section t1-t2, only the switches SW1, SW3, and SW5 are turned on, while the NMOS transistors M3 and M4 and the PMOS transistors Mc9, Mc10, M7, and M8 are turned off. Because the gates of the NMOS transistors M1 and M2 receive the same input signal Vip, the back-to-back inverter 103 determines which one of the two current branches I1 and I2 has the input referred offset and accordingly generates two control signals Vonc and Vopc having different logic states for the multiplexers 115 and 117 so that the multiplexers 115 and 117 can respectively output two reference voltages Vrt and Vrb having different voltage levels. In other words, the dynamic comparator 100 compares the value of the input referred offset during the time section t1-t2 and determines which one of the two current branches I1 and I2 has the input referred offset. Meanwhile, the two comparison signals Von and Vop are pulled up to the system voltage Vdd. In other words, the back-to-back inverter 105 is reset during the time section t1-t2.

Thereafter, during the time section t2-t3, only the switches SW2, SW4, and SW6 are turned on, while the NMOS transistors Mc3 and Mc4 and the PMOS transistors Mc9, Mc10, M7, and M8 are turned off. In this case, the two calibration voltages Vcon and Vcop are affected by charge redistribution between the capacitors Cp, Cp', Cc, and Cc' so that new calibration voltages are generated (i.e., the voltage levels of the calibration voltages Vcon and Vcop are updated) and respectively provided to the bulks of the NMOS transistors M1 and M2, so as to change the threshold voltage (Vth) of the NMOS transistors M1 and M2 and calibrate the input referred offset of the input differential pair. Meanwhile, the control signals Von and Vop are both pulled up to somewhere close to the system voltage Vdd (i.e., the output of the back-to-back inverter 105 enters the metastable state).

Finally, during the time section t3-t4, only the switches SW2, SW4, and SW6 are turned on, while the NMOS transistors Mc3 and Mc4 and the PMOS transistors Mc7, Mc8, M9, and M10 are turned off. Thus, the gates of the NMOS transistors M1 and M2 receive two different input signals Vip and Vin. The back-to-back inverter 105 determines the difference between the two input signals Vip and Vin received by the input differential pair 101 after the input referred offset is calibrated and outputs two comparison signals Von and Vop accordingly. In other words, the dynamic comparator 100 compares the input differential signals during the time section t3-t4. Meanwhile, the control signals Vonc and Vopc are both pulled up to the system voltage Vdd (i.e., the back-to-back inverter 103 is reset during the time section t3-t4) so that the multiplexers 115 and 117 both output a reference voltage Vrt having a high voltage level.

In the present embodiment, each period of the clock signal CLK is divided into 4 time sections t0-t1, t1-t2, t2-t3, and t3-t4 such that the dynamic comparator 100 can repeatedly carry out background offset calibration.

Figure 3:
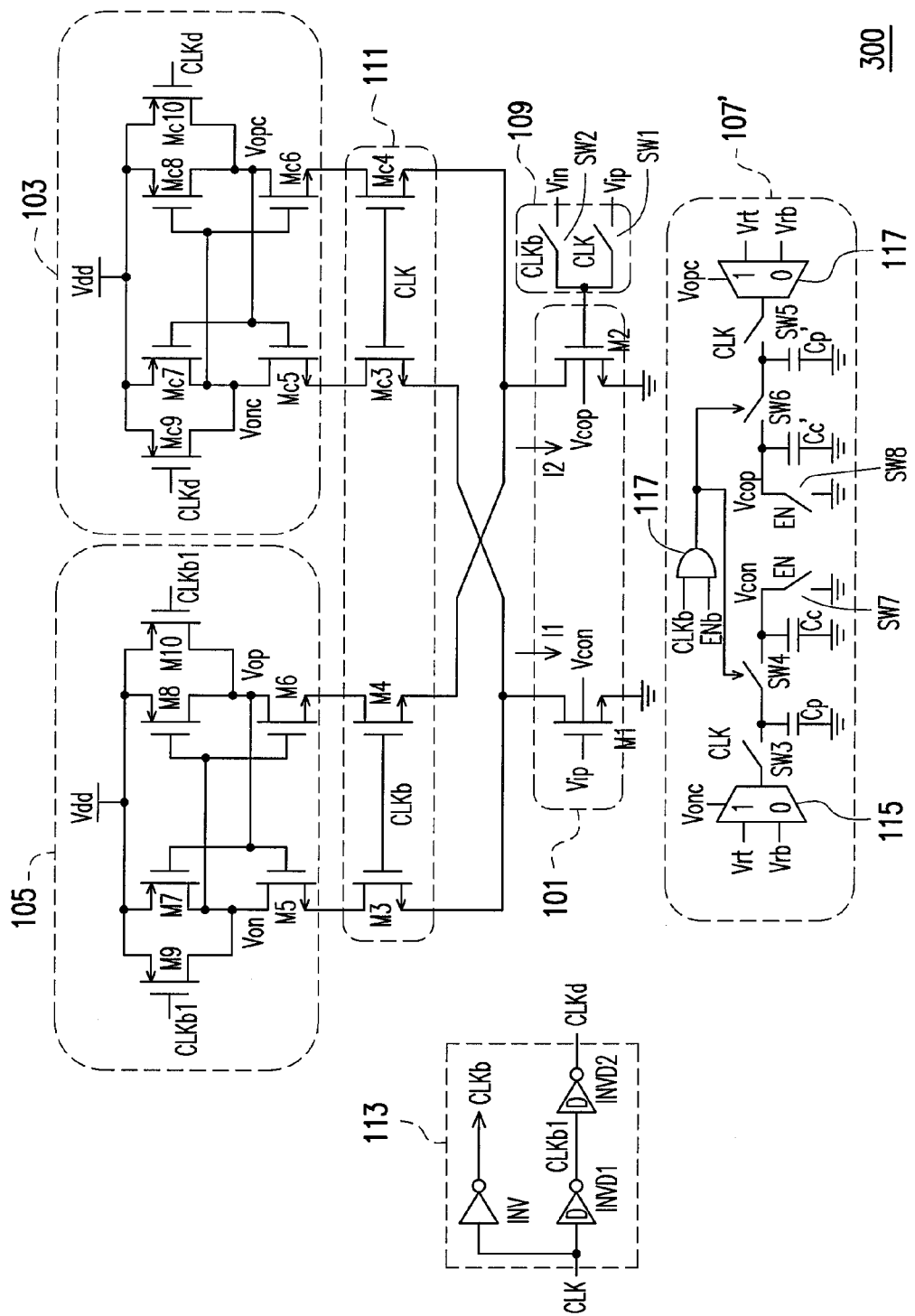
FIG. 3 is a block diagram of a dynamic comparator with background offset calibration according to another embodiment.

Besides, the dynamic comparator 100 can control the on/off of the background offset calibration function thereof. FIG. 3 is a block diagram of a dynamic comparator with background offset calibration according to another embodiment of the present invention. Referring to both FIG. 1 and FIG. 3, the difference between the dynamic comparator 300 and the dynamic comparator 100 is that the integrator 107' in the dynamic comparator 300 further includes an AND gate 117 and two switches SW7 and SW8. Two input terminals of the AND gate 117 respectively receive a clock signal CLKb and a reverse signal ENb of an enabling signal EN (both provided by the system), and the output terminal of the AND gate 117 is coupled to the control terminals of the switches SW4 and SW6. The first terminal of the switch SW7 is coupled to the second terminal of the switch SW4, the control terminal of the switch SW7 receives the enabling signal EN, and the second terminal of the switch SW7 is coupled to the ground. The first terminal of the switch SW8 is coupled to the second terminal of the switch SW6, the control terminal of the switch SW8 receives the enabling signal EN, and the second terminal of the switch SW8 is coupled to the ground.

Accordingly, if the enabling signal EN is logic high, the output of the AND gate 117 is logic low, so that the switches SW4 and SW6 are turned off and the switches SW7 and SW8 are turned on. Herein the calibration voltages Vcon and Vcop output by the integrator 107' are pulled down to the ground level. Accordingly, the calibration voltages Vcon and Vcop respectively received by the bulks of the NMOS transistors M1 and M2 in the input differential pair 101 are both at ground level, so that the dynamic comparator 300 cannot carry out background offset calibration but can carry out initial reset.

[Second Embodiment]

Figure 4:
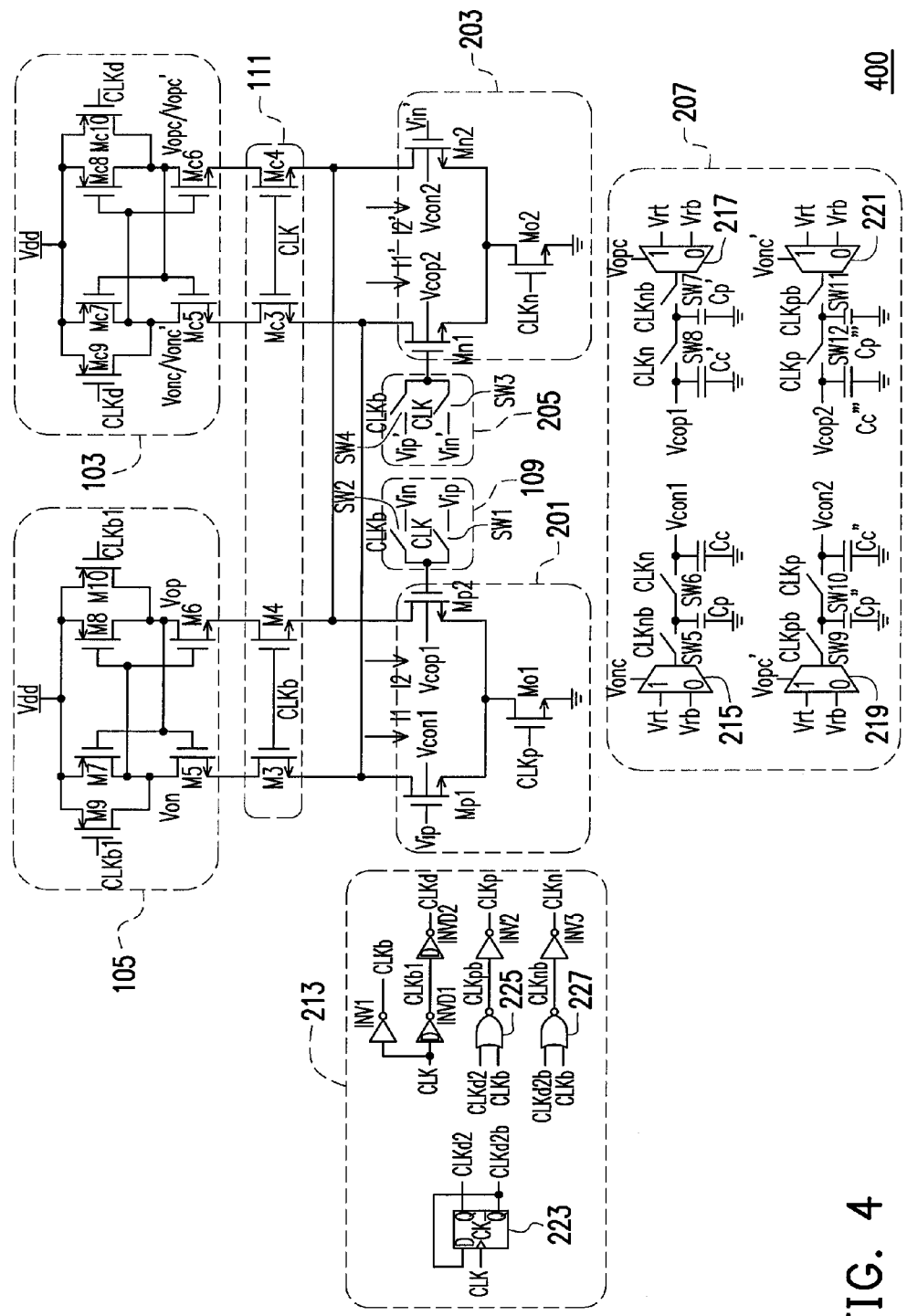
FIG. 4 is a block diagram of a dynamic comparator with background offset calibration according to a second embodiment.

FIG. 4 is a block diagram of a dynamic comparator with background offset calibration according to a second embodiment of the present disclosure. Referring to FIG. 4, the dynamic comparator 400 includes two input differential pairs 201 and 203, two back-to-back inverters 103 and 105, an integrator 207, two multiplexers 109 and 205, a de-multiplexer 111, and a clock generator 213. It should be mentioned herein that like reference numerals in FIG. 4 and FIG. 1 represent similar functions and circuit structures.

The input differential pair 201 includes two current branches I1 and I2, and one of the current branches I1 and I2 has a first input referred offset. Besides, the input differential pair 203 includes two current branches I1' and I2', and one of the current branches I1' and I2' has a second input referred offset. The first input referred offset and the second input referred offset are both produced by the dynamic comparator 400 due to process mismatch.

The back-to-back inverter 103 is coupled to the input differential pairs 201 and 203. The back-to-back inverter 103 determines which one of the current branches I1 and I2 has the first input referred offset in response to clock signals CLKd and CLKp and accordingly generates two control signals Vonc and Vopc. Besides, the back-to-back inverter 103 also determines which one of the current branches I1' and I2' has the second input referred offset in response to clock signals CLKd and CLKn and accordingly generates another two control signals Vonc' and Vopc'.

The integrator 207 is coupled to the back-to-back inverter 103. The integrator 207 generates two calibration voltages Vcon1 and Vcop1 for the input differential pair 201 in response to the control signals Vonc and Vopc, so as to calibrate the first input referred offset. In addition, the integrator 207 also generates another two calibration voltages Vcon2 and Vcop2 for the input differential pair 203 in response to the control signals Vonc' and Vopc', so as to calibrate the second input referred offset.

The back-to-back inverter 105 is coupled to the input differential pairs 201 and 203. The back-to-back inverter 105 determines the difference between four input signals Vip, Vin, Vip', and Vin' received by the input differential pairs 201 and 203 after the first input referred offset and the second input referred offset are calibrated in response to clock signals CLKb1, CLKp, and CLKn and outputs two comparison signals Von and Vop accordingly.

The multiplexer 109 is coupled to the input differential pair 201 for receiving the input signals Vip and Vin among the four input signals and outputs one of the input signals Vip and Vin in response to the clock signal CLK. The multiplexer 109 includes two switches SW1 and SW2. The first terminal of the switch SW1 receives the input signal Vip, and the control terminal of the switch SW1 receives the clock signal CLK. The first terminal of the switch SW2 receives the input signal Vin, and the control terminal of the switch SW2 receives the clock signal CLKb.

The multiplexer 205 is coupled to the input differential pair 203. The multiplexer 205 receives the input signals Vip' and Vin' among the four input signals and outputs one of the input signals Vip' and Vin' in response to the clock signal CLK. The multiplexer 205 includes two switches SW3 and SW4. The first terminal of the switch SW3 receives the input signal Vin', and the control terminal of the switch SW3 receives the clock signal CLK. The first terminal of the switch SW4 receives the input signal Vip', and the control terminal of the switch SW4 receives the clock signal CLKb.

The input differential pair 201 includes NMOS transistors Mp1, Mp2, and Mo1. The gate of the NMOS transistor Mp1 receives the input signal Vip, and the bulk of the NMOS transistor Mp1 receives the calibration voltage Vcon1. The gate of the NMOS transistor Mp2 is coupled to the second terminals of the switches SW1 and SW2, and the bulk of the NMOS transistor Mp2 receives the calibration voltage Vcop1. The gate of the NMOS transistor Mo1 receives the clock signal CLKp, the drain of the NMOS transistor Mo1 is coupled to the sources of the NMOS transistors Mp1 and Mp2, and the source of the NMOS transistor Mo1 is coupled to the ground.

The input differential pair 203 includes NMOS transistors Mn1, Mn2, and Mo2. The gate of the NMOS transistor Mn1 is coupled to the second terminals of the switches SW3 and SW4, and the bulk of the NMOS transistor Mn1 receives the calibration voltage Vcop2. The gate of the NMOS transistor Mn2 receives the input signal Vin', and the bulk of the NMOS transistor Mn2 receives the calibration voltage Vcon2. The gate of the NMOS transistor Mo2 receives the clock signal CLKn, the drain of the NMOS transistor Mo2 is coupled to the sources of the NMOS transistors Mn1 and Mn2, and the source of the NMOS transistor Mo2 is coupled to the ground.

The de-multiplexer 111 is coupled to the input differential pairs 201 and 203 and the back-to-back inverters 103 and 105. The de-multiplexer 111 receives the drain voltages of the NMOS transistors Mp1, Mp2, Mn1, and Mn2 and outputs the drain voltages to the back-to-back inverter 103 in response to the clock signal CLK. In the present embodiment, the de-multiplexer 111 includes NMOS transistors M3, M4, Mc3, and Mc4. The gate of the NMOS transistor M3 receives the clock signal CLKb, and the source of the NMOS transistor M3 is coupled to the drains of the NMOS transistors Mp1 and Mn1. The gate of the NMOS transistor M4 receives the clock signal CLKb, and the source of the NMOS transistor M4 is coupled to the drains of the transistors Mp2 and Mn2. The gate of the NMOS transistor Mc3 receives the clock signal CLK, and the source of the NMOS transistor Mc3 is coupled to the drains of the NMOS transistors Mp1 and Mn1. The gate of the NMOS transistor Mc4 receives the clock signal CLK, and the source of the NMOS transistor Mc4 is coupled to the drains of the NMOS transistors Mp2 and Mn2.

The back-to-back inverter 103 includes NMOS transistors Mc5 and Mc6 and PMOS transistors Mc7~Mc10. The source of the NMOS transistor Mc5 is coupled to the drain of the NMOS transistor Mc3, and the drain of the NMOS transistor Mc5 outputs the control signal Vonc/Vonc'. The source of the NMOS transistor Mc6 is coupled to the drain of the NMOS transistor Mc4, and the drain of the NMOS transistor Mc6 outputs the control signal Vopc/Vopc'.

The gate of the PMOS transistor Mc7 is coupled to the gate of the NMOS transistor Mc5 and the drain of the NMOS transistor Mc6, the source of the PMOS transistor Mc7 receives a system voltage Vdd, and the drain of the PMOS transistor Mc7 is coupled to the drain of the NMOS transistor Mc5. The gate of the PMOS transistor Mc8 is coupled to the gate of the NMOS transistor Mc6 and the drain of the NMOS transistor Mc5, the source of the PMOS transistor Mc8 receives the system voltage Vdd, and the drain of the PMOS transistor Mc8 is coupled to the drain of the NMOS transistor Mc6. The gate of the PMOS transistor Mc9 receives the clock signal CLKd, the source of the PMOS transistor Mc9 receives the system voltage Vdd, and the drain of the PMOS transistor Mc9 is coupled to the drain of the NMOS transistor Mc5. The gate of the PMOS transistor Mc10 receives the clock signal CLKd, the source of the PMOS transistor Mc10 receives the system voltage Vdd, and the drain of the PMOS transistor Mc10 is coupled to the drain of the NMOS transistor Mc6.

The back-to-back inverter 105 includes NMOS transistors M5 and M6 and PMOS transistors M7~M10. The source of the NMOS transistor M5 is coupled to the drain of the NMOS transistor M3, and the drain of the NMOS transistor M5 outputs the comparison signal Von. The source of the NMOS transistor M6 is coupled to the drain of the NMOS transistor M4, and the drain of the NMOS transistor M6 outputs the comparison signal Vop.

The gate of the PMOS transistor M7 is coupled to the gate of the NMOS transistor M5 and the drain of the NMOS transistor M6, the source of the PMOS transistor M7 receives the system voltage Vdd, and the drain of the PMOS transistor M7 is coupled to the drain of the NMOS transistor M5. The gate of the PMOS transistor M8 is coupled to the gate of the NMOS transistor M6 and the drain of the NMOS transistor M5, the source of the PMOS transistor M8 receives the system voltage Vdd, and the drain of the PMOS transistor M8 is coupled to the drain of the NMOS transistor M6. The gate of the PMOS transistor M9 receives the clock signal CLKb1, the source of the PMOS transistor M9 receives the system voltage Vdd, and the drain of the PMOS transistor M9 is coupled to the drain of the NMOS transistor M5. The gate of the PMOS transistor M10 receives the clock signal CLKb1, the source of the PMOS transistor M10 receives the system voltage Vdd, and the drain of the PMOS transistor M10 is coupled to the drain of the NMOS transistor M6.

The integrator 207 includes multiplexers 215, 217, 219, and 221, switches SW5~SW12, and capacitors Cp, Cp', Cp", Cp''', Cc, Cc', Cc", and Cc'''. The multiplexer 215 receives reference voltages Vrt and Vrb having different voltage levels and outputs one of the reference voltages Vrt and Vrb in response to the control signal Vonc. The first terminal of the switch SW5 receives the output of the multiplexer 215, and the control terminal of the switch SW5 receives the clock signal CLKnb, wherein the phase difference between the clock signal CLKn and the clock signal CLKnb is 180°. The first terminal of the capacitor Cp is coupled to the second terminal of the switch SW5, and the second terminal of the capacitor Cp is coupled to the ground. The first terminal of the switch SW6 is coupled to the first terminal of the capacitor Cp, the control terminal of the switch SW6 receives the clock signal CLKn, and the second terminal of the switch SW6 outputs the calibration voltage Vcon1. The first terminal of the capacitor Cc is coupled to the second terminal of the switch SW6, and the second terminal of the capacitor Cc is coupled to the ground.

The multiplexer 217 receives the reference voltages Vrt and Vrb and outputs one of the reference voltages Vrt and Vrb in response to the control signal Vopc. The first terminal of the switch SW7 receives the output of the multiplexer 217, and the control terminal of the switch SW7 receives the clock signal CLKnb. The first terminal of the capacitor Cp' is coupled to the second terminal of the switch SW7, and the second terminal of the capacitor Cp' is coupled to the ground. The first terminal of the switch SW8 is coupled to the first terminal of the capacitor Cp', the control terminal of the switch SW8 receives the clock signal CLKn, and the second terminal of the switch SW8 outputs the calibration voltage Vcop1. The first terminal of the capacitor Cc' is coupled to the second terminal of the switch SW8, and the second terminal of the capacitor Cc' is coupled to the ground.

The multiplexer 219 receives the reference voltages Vrt and Vrb and outputs one of the reference voltages Vrt and Vrb in response to the control signal Vopc'. The first terminal of the switch SW9 receives the output of the multiplexer 219, and the control terminal of the switch SW9 receives the clock signal CLKpb, wherein the phase difference between the clock signal CLKp and the clock signal CLKpb is 180°. The first terminal of the capacitor Cp'' is coupled to the second terminal of the switch SW9, and the second terminal of the capacitor Cp'' is coupled to the ground. The first terminal of the switch SW10 is coupled to the first terminal of the capacitor Cp'', the control terminal of the switch SW10 receives the clock signal CLKp, and the second terminal of the switch SW10 outputs the calibration voltage Vcon2. The first terminal of the capacitor Cc'' is coupled to the second terminal of the switch SW10, and the second terminal of the capacitor Cc'' is coupled to the ground.

The multiplexer 221 receives the reference voltages Vrt and Vrb and outputs one of the reference voltages Vrt and Vrb in response to the control signal Vonc'. The first terminal of the switch SW11 receives the output of the multiplexer 221, and the control terminal of the switch SW11 receives the clock signal CLKpb. The first terminal of the capacitor Cp''' is coupled to the second terminal of the switch SW11, and the second terminal of the capacitor Cp''' is coupled to the ground. The first terminal of the switch SW12 is coupled to the first terminal of the capacitor Cp''', the control terminal of the switch SW12 receives the clock signal CLKp, and the second terminal of the switch SW12 outputs the calibration voltage Vcop2. The first terminal of the capacitor Cc''' is coupled to the second terminal of the switch SW12, and the second terminal of the capacitor Cc''' is coupled to the ground.

In the present embodiment, the capacitors Cp, Cp', Cp'', and Cp''' have the same capacitance, and the capacitors Cc, Cc', Cc'', and Cc''' have the same capacitance, wherein the capacitance of the capacitors Cc, Cc', Cc'', and Cc''' is greater than that of the capacitors Cp, Cp', Cp'', and Cp'''. However, the present invention is not limited thereto.

Figure 5:
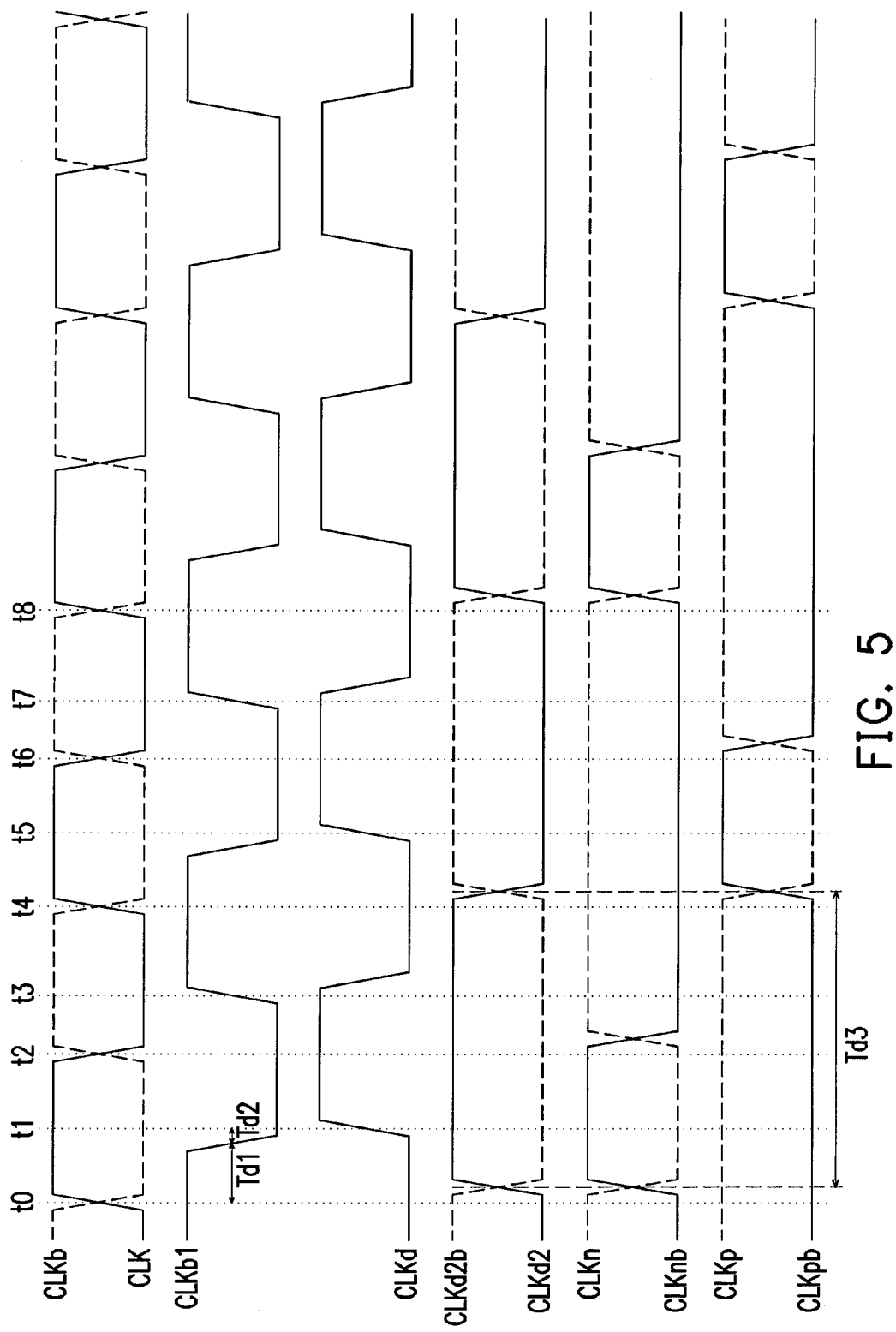
FIG. 5 is an operation timing diagram of the dynamic comparator in FIG. 4.

In addition, the clock generator 213 respectively generates the clock signals CLKb, CLKb1, CLKd, CLKd2, CLKd2b, CLKp, CLKpb, CLKn, and CLKnb according to the received clock signal CLK, and the relationship between the clock signals CLK, CLKb, CLKb1, CLKd, CLKd2, CLKd2b, CLKp, CLKpb, CLKn, and CLKnb is illustrated in FIG. 5.

In the present embodiment, the clock generator 213 includes inverters INV1~INV3, delay inverters INVD1 and INVD2, a D flip-flop (FF) 223, and NOR gates 225 and 227.

The input terminal of the inverter INV1 receives the clock signal CLK, and the output terminal of the inverter INV1 outputs the clock signal CLKb. The input terminal of the delay inverter INVD1 receives the clock signal CLK, and the output terminal of the delay inverter INVD1 outputs the clock signal CLKb1. The input terminal of the delay inverter INVD2 receives the clock signal CLKb1, and the output terminal of the delay inverter INVD2 outputs the clock signal CLKd.

The clock signal receiving terminal (CK) of the D FF 223 receives the clock signal CLK, the data receiving terminal (D) and output terminal ($\overline{Q}$) of the D FF 223 are coupled with each other for outputting the clock signal CLKd2b, and another output terminal (Q) of the D FF 223 outputs the clock signal CLKd2. Accordingly, the D FF 223 is connected as a divide-by-2 circuit.

The two input terminals of the NOR gate 225 respectively receive the clock signal CLKd2 and the clock signal CLKb, and the output terminal of the NOR gate 225 outputs the clock signal CLKpb. The input terminal of the inverter INV2 receives the clock signal CLKpb, and the output terminal of the inverter INV2 outputs the clock signal CLKp. The two input terminals of the NOR gate 227 respectively receive the clock signal CLKd2b and the clock signal CLKb, and the output terminal of the NOR gate 227 outputs the clock signal CLKnb. The input terminal of the inverter INV3 receives the clock signal CLKnb, and the output terminal of the inverter INV3 outputs the clock signal CLKn.

As shown in FIG. 5, the phase difference between the clock signal CLK and the clock signal CLKb is 180° (i.e., the clock signal CLK and the clock signal CLKb are reverse to each other), a delay time Td1 exists between the clock signal CLKb1 and the clock signal CLK, and a delay time Td2 exists between the clock signal CLKb1 and the clock signal CLKd. Besides, the period of the clock signals CLKp and CLKn is twice of that of the clock signals CLKd, CLKb1, CLK, and CLKb, and the duty cycle of the clock signals CLKp, and CLKn has to be greater than or equal to 75%. The delay time Td3 between the clock signal CLKp and the clock signal CLKn has to be greater than or equal to one period of the clock signal CLK. The period of the clock signals CLKd2 and CLKd2b is also twice of that of the clock signals CLKd, CLKb1, CLK, and CLKb, the duty cycle of the clock signals CLKd2 and CLKd2b is 50%, and the phase difference between the clock signal CLKd2 and the clock signal CLKd2b is 180°.

As shown in FIG. 5, two periods of the clock signal CLK are divided into 8 time sections t0-t1, t1-t2, t2-t3, t3-t4, t4-t5, t5-t6, t6-t7, and t7-t8. During the time section t042, the dynamic comparator 400 performs an input referred offset comparison to the input differential pair 201. During the time section t4-t6, the dynamic comparator 400 performs an input referred offset comparison to the input differential pair 203. During the time sections t2-t4 and t6-t8, the dynamic comparator 400 performs differential difference input signal comparison to the input differential pairs 201 and 203.

Regardless of the time section t0-t4 or the time section t4-t8, the procedure of performing one input referred offset comparison or differential difference input signal comparison is similar to that described in the first embodiment. Thus, the operation of the dynamic comparator 400 (based on the timing diagram illustrated in FIG. 5) should be understood by those having ordinary knowledge in the art according to the description of the first embodiment therefore will not be described again herein.

Figure 6:
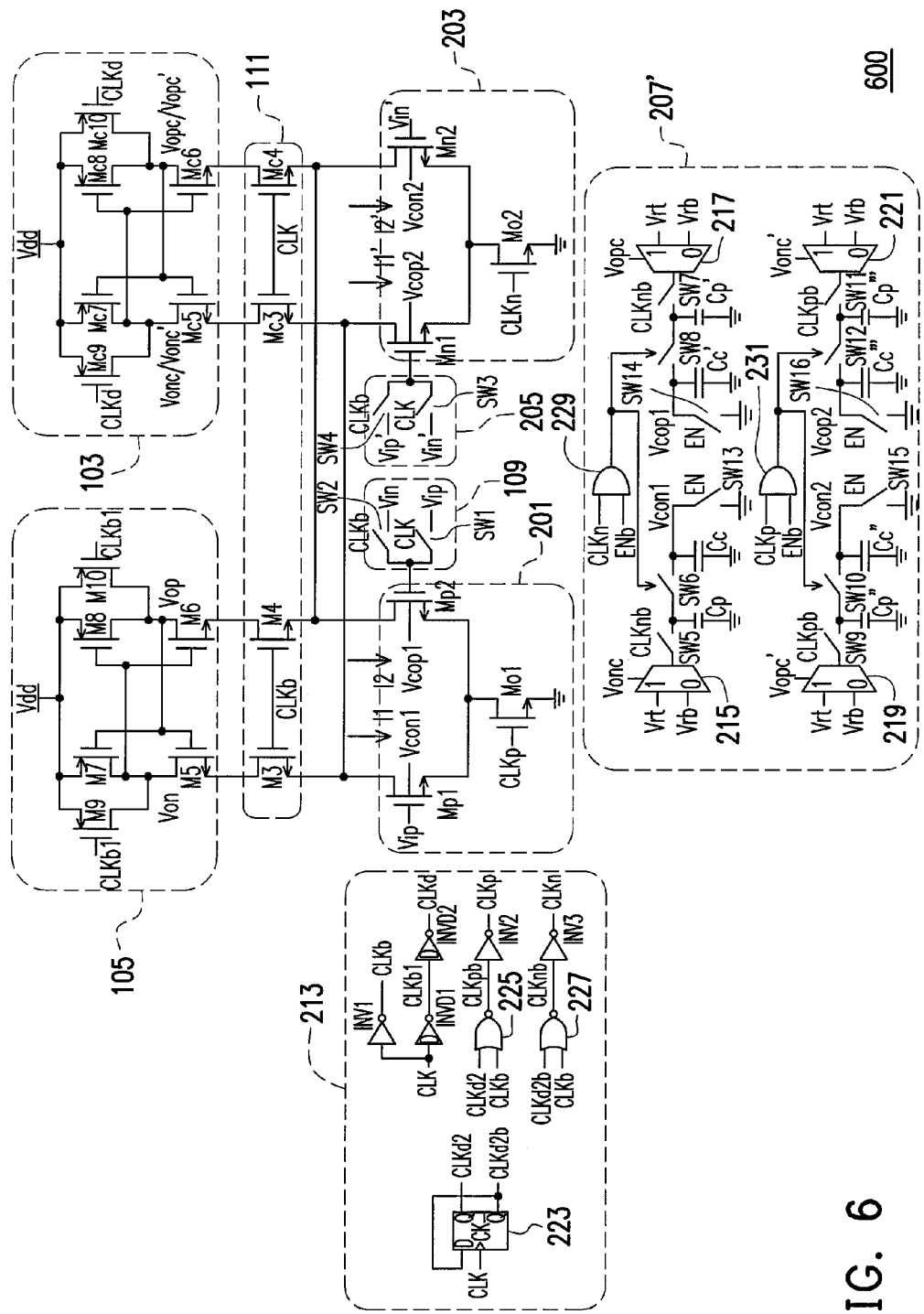
FIG. 6 is a block diagram of a dynamic comparator with background offset calibration according to another embodiment.

Similarly, the dynamic comparator 400 can control the on/off of the background offset calibration function thereof. FIG. 6 is a block diagram of a dynamic comparator with background offset calibration according to another embodiment of the present invention. Referring to both FIG. 4 and FIG. 6, the difference between the dynamic comparator 600 and the dynamic comparator 400 is that the integrator 207' of the dynamic comparator 600 further includes two AND gates 229 and 231 and four switches SW13~SW16. The two input terminals of the AND gate 229 respectively receive the clock signal CLKn and a reverse signal ENb of the enabling signal EN (both provided by the system), and the output terminal of the AND gate 229 is coupled to the control terminals of the switches SW6 and SW8. The two input terminals of the AND gate 231 respectively receive the clock signal CLKp and the reverse signal ENb of the enabling signal EN, and the output terminal of the AND gate 231 is coupled to the control terminals of the switches SW10 and SW12.

The first terminal of the switch SW13 is coupled to the second terminal of the switch SW6, the control terminal of the switch SW13 receives the enabling signal EN, and the second terminal of the switch SW13 is coupled to the ground. The first terminal of the switch SW14 is coupled to the second terminal of the switch SW8, the control terminal of the switch SW14 receives the enabling signal EN, and the second terminal of the switch SW14 is coupled to the ground. The first terminal of the switch SW15 is coupled to the second terminal of the switch SW10, the control terminal of the switch SW15 receives the enabling signal EN, and the second terminal of the switch SW15 is coupled to the ground. The first terminal of the switch SW16 is coupled to the second terminal of the switch SW12, the control terminal of the switch SW16 receives the enabling signal EN, and the second terminal of the switch SW16 is coupled to the ground.

Accordingly, if the enabling signal EN is logic high, the switches SW6, SW8, SW10, and SW12 are turned off, and the switches SW13, SW14, SW15, and SW16 are turned on. Herein the calibration voltages Vcon1, Vcop1, Vcop2, and Vcon2 output by the integrator 207' are pulled down to the ground level, so that the calibration voltages Vcon1, Vcop1, Vcop2, and Vcon2 received by the bulks of the four NMOS transistors Mp1, Mp2, Mn1, and Mn2 in the input differential pairs 201 and 203 are all at the ground level. Thus, the dynamic comparator 600 cannot carry out background offset calibration but can carry out initial reset.

It should be mentioned herein that because the dynamic comparators 400 and 600 illustrated in FIG. 4 and FIG. 6 respectively include two input differential pairs 201 and 203, the dynamic comparators 400 and 600 can carry out differential difference input signal comparison. However, since the dynamic comparators 100 and 300 illustrated in FIG. 1 and FIG. 3 only include an input differential pair 101, the dynamic comparators 100 and 300 can only carry out differential input signal comparison.

As described above, a dynamic comparator with background offset calibration is provided in each embodiment of the present invention, wherein a background offset calibration is performed, and no preamplifier or sampling capacitor is disposed on the input signal path. Thus, the signal bandwidth is not affected, the surface area of the chip is not increased, and the requirements of high speed, low power consumption, and medium/high resolution are fulfilled. In addition, because the offset calibration mechanism can be carried out in parallel, different dynamic comparators do not affect each other. Thereby, the complexity of the offset calibration circuit is reduced and the convergence rate of offset calibration is increased.

In other words, the dynamic comparator with background offset calibration provided by embodiments of the present invention has following advantages:

1. a dynamic circuit structure is adopted so that no quiescent current consumption is produced.

2. only a local feedback network is used as to the offset calibration, so that it is not necessary to use a complicated global feedback network.

3. all the comparators perform background offset calibration independently and in parallel.

4. as to the control signals of the offset calibration, it is not necessary to use a complicated high-speed non-overlap clock generator.

5. no preamplifier is required on the input signal path, so that there is no additional quiescent current consumption or bandwidth limitation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic comparator with background offset calibration, comprising:
    a first input differential pair, comprising two first current branches, wherein one of the two first current branches has a first input referred offset;
    a second input differential pair, comprising two second current branches, wherein one of the two second current branches has a second input referred offset;
    a first back-to-back inverter, coupled to the first input differential pair and the second input differential pair, for determining which one of the two first current branches has the first input referred offset in response to a first clock signal and a second clock signal and generating two control signals correspondingly, and for determining which one of the two second current branches has the second input referred offset in response to the first clock signal and a third clock signal and generating another two control signals accordingly;
    an integrator, coupled to the first back-to-back inverter, for generating two calibration voltages for the first input differential pair in response to the two control signals, so as to calibrate the first input referred offset, and for generating another two calibration voltages for the second input differential pair in response to the another two control signals, so as to calibrate the second input referred offset; and
    a second back-to-back inverter, coupled to the first input differential pair and the second input differential pair, for determining a difference between four input signals received by the first input differential pair and the second input differential pair after the first input referred offset and the second input referred offset are calibrated in response to the second clock signal, the third clock signal, and a fourth clock signal and outputting two comparison signals accordingly.

2. The dynamic comparator according to claim 1 further comprising:
    a first multiplexer, coupled to the first input differential pair, for receiving two of the four input signals and outputting one of the two input signals in response to a fifth clock signal; and
    a second multiplexer, coupled to the second input differential pair, for receiving another two of the four input signals and outputting one of the another two input signals in response to the fifth clock signal.

3. The dynamic comparator according to claim 2, wherein the four input signals comprise a first input signal, a second input signal, a third input signal, and a fourth input signal, and the first multiplexer comprises:
    a first switch, having a first terminal for receiving the first input signal and a control terminal for receiving the fifth clock signal; and
    a second switch, having a first terminal for receiving the second input signal and a control terminal for receiving a sixth clock signal, wherein a phase difference between the fifth clock signal and the sixth clock signal is 180°, a first delay time exists between the fourth clock signal and the fifth clock signal, a second delay time exists between the first clock signal and the fourth clock signal, a period of the second clock signal and the third clock signal is two times of a period of the first clock signal, the fourth clock signal, the fifth clock signal, and the sixth clock signal, a duty cycle of the second clock signal and the third clock signal is substantially greater than or equal to 75%, a third delay time exists between the second clock signal and the third clock signal, and the third delay time is substantially greater than or equal to one period of the fifth clock signal.

4. The dynamic comparator according to claim 3, wherein the second multiplexer comprises:
   a third switch, having a first terminal for receiving the third input signal and a control terminal for receiving the fifth clock signal; and
   a fourth switch, having a first terminal for receiving the fourth input signal and a control terminal for receiving the sixth clock signal.

5. The dynamic comparator according to claim 4, wherein the two calibration voltages comprise a first calibration voltage and a second calibration voltage, and the first input differential pair comprises:
   a first transistor, having a gate for receiving the first input signal and a bulk for receiving the first calibration voltage;
   a second transistor, having a gate coupled to second terminals of the first switch and the second switch and a bulk for receiving the second calibration voltage; and
   a third transistor, having a gate for receiving the second clock signal, a drain coupled to sources of the first transistor and the second transistor, and a source coupled to a ground.

6. The dynamic comparator according to claim 5, wherein the another two calibration voltages comprise a third calibration voltage and a fourth calibration voltage, and the second input differential pair comprises:
   a fourth transistor, having a gate coupled to second terminals of the third switch and the fourth switch and a bulk for receiving the third calibration voltage;
   a fifth transistor, having a gate for receiving the third input signal and a bulk for receiving the fourth calibration voltage; and
   a sixth transistor, having a gate for receiving the third clock signal, a drain coupled to sources of the fourth transistor and the fifth transistor, and a source coupled to the ground.

7. The dynamic comparator according to claim 6 further comprising:
   a de-multiplexer, coupled to the first input differential pair, the second input differential pair, the first back-to-back inverter, and the second back-to-back inverter, for receiving drain voltages of the first transistor and the second transistor or the third transistor and the fourth transistor and outputting the drain voltages to the first back-to-back inverter or the second back-to-back inverter in response to the fifth clock signal.

8. The dynamic comparator according to claim 7, wherein the de-multiplexer comprises:
   a seventh transistor, having a gate for receiving the sixth clock signal and a source coupled to drains of the first transistor and the fourth transistor;
   an eighth transistor, having a gate for receiving the sixth clock signal and a source coupled to drains of the second transistor and the fifth transistor;
   a ninth transistor, having a gate for receiving the fifth clock signal and a source coupled to the drains of the first transistor and the fourth transistor; and
   a tenth transistor, having a gate for receiving the fifth clock signal and a source coupled to the drains of the second transistor and the fifth transistor.

9. The dynamic comparator according to claim 8, wherein the two control signals comprise a first control signal and a second control signal, the another two control signals comprise a third control signal and a fourth control signal, and the first back-to-back inverter comprises:
   an eleventh transistor, having a source coupled to a drain of the ninth transistor and a drain for outputting the first control signal or the third control signal;
   a twelfth transistor, having a source coupled to a drain of the tenth transistor and a drain for outputting the second control signal or the fourth control signal;
   a thirteenth transistor, having a gate coupled to a gate of the eleventh transistor and the drain of the twelfth transistor, a source for receiving a system voltage, and a drain coupled to the drain of the eleventh transistor;
   a fourteenth transistor, having a gate coupled to a gate of the twelfth transistor and the drain of the eleventh transistor, a source for receiving the system voltage, and a drain coupled to the drain of the twelfth transistor;
   a fifteenth transistor, having a gate for receiving the first clock signal, a source for receiving the system voltage, and a drain coupled to the drain of the eleventh transistor; and
   a sixteenth transistor, having a gate for receiving the first clock signal, a source for receiving the system voltage, and a drain coupled to the drain of the twelfth transistor.

10. The dynamic comparator according to claim 9, wherein the two comparison signals comprise a first comparison signal and a second comparison signal, and the second back-to-back inverter comprises:
    a seventeenth transistor, having a source coupled to a drain of the seventh transistor and a drain for outputting the first comparison signal;
    an eighteenth transistor, having a source coupled to a drain of the eighth transistor and a drain for outputting the second comparison signal;
    a nineteenth transistor, having a gate coupled to a gate of the seventeenth transistor and the drain of the eighteenth transistor, a source for receiving the system voltage, and a drain coupled to the drain of the seventeenth transistor;
    a twentieth transistor, having a gate coupled to a gate of the eighteenth transistor and the drain of the seventeenth transistor, a source for receiving the system voltage, and a drain coupled to the drain of the eighteenth transistor;
    a twenty first transistor, having a gate for receiving the fourth clock signal, a source for receiving the system voltage, and a drain coupled to the drain of the seventeenth transistor; and
    a twenty second transistor, having a gate for receiving the fourth clock signal, a source for receiving the system voltage, and a drain coupled to the drain of the eighteenth transistor.

11. The dynamic comparator according to claim 10, wherein the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the seventeenth transistor, and the eighteenth transistor are NMOS transistors, and the thirteenth transistor, the fourteenth transistor, the fifteenth transistor, the sixteenth transistor, the nineteenth transistor, the twentieth transistor, the twenty first transistor, and the twenty second transistor are PMOS transistors.

12. The dynamic comparator according to claim 10, wherein the integrator comprises:
a third multiplexer, for receiving two reference voltages having different voltage levels and outputting one of the two reference voltages in response to the first control signal;
a fifth switch, having a first terminal for receiving an output of the third multiplexer and a control terminal for receiving a seventh clock signal, wherein a phase difference between the third clock signal and the seventh clock signal is 180°;
a first capacitor, having a first terminal coupled to a second terminal of the fifth switch and a second terminal coupled to the ground;
a sixth switch, having a first terminal coupled to the first terminal of the first capacitor, a control terminal for receiving the third clock signal, and a second terminal for outputting the first calibration voltage;
a second capacitor, having a first terminal coupled to the second terminal of the sixth switch and a second terminal coupled to the ground;
a fourth multiplexer, for receiving the two reference voltages and outputting one of the two reference voltages in response to the second control signal;
a seventh switch, having a first terminal for receiving an output of the fourth multiplexer and a control terminal for receiving the seventh clock signal;
a third capacitor, having a first terminal coupled to a second terminal of the seventh switch and a second terminal coupled to the ground;
an eighth switch, having a first terminal coupled to the first terminal of the third capacitor, a control terminal for receiving the third clock signal, and a second terminal for outputting the second calibration voltage;
a fourth capacitor, having a first terminal coupled to the second terminal of the eighth switch and a second terminal coupled to the ground;
a fifth multiplexer, for receiving the two reference voltages and outputting one of the two reference voltages in response to the third control signal;
a ninth switch, having a first terminal for receiving an output of the fifth multiplexer and a control terminal for receiving an eighth clock signal, wherein a phase difference between the second clock signal and the eighth clock signal is 180°;
a fifth capacitor, having a first terminal coupled to a second terminal of the ninth switch and a second terminal coupled to the ground;
a tenth switch, having a first terminal coupled to the first terminal of the fifth capacitor, a control terminal for receiving the second clock signal, and a second terminal for outputting the third calibration voltage;
a sixth capacitor, having a first terminal coupled to the second terminal of the tenth switch and a second terminal coupled to the ground;
a sixth multiplexer, for receiving the two reference voltages and outputting one of the two reference voltages in response to the fourth control signal;
a eleventh switch, having a first terminal for receiving an output of the sixth multiplexer and a control terminal for receiving the eighth clock signal;

a seventh capacitor, having a first terminal coupled to a second terminal of the eleventh switch and a second terminal coupled to the ground;
a twelfth switch, having a first terminal coupled to the first terminal of the seventh capacitor, a control terminal for receiving the second clock signal, and a second terminal for outputting the fourth calibration voltage; and
an eighth capacitor, having a first terminal coupled to the second terminal of the twelfth switch and a second terminal coupled to the ground.

13. The dynamic comparator according to claim 12, wherein the first capacitor, the third capacitor, the fifth capacitor, and the seventh capacitor have a same capacitance, the second capacitor, the fourth capacitor, the sixth capacitor, and the eighth capacitor have a same capacitance, and the capacitance of the second capacitor, the fourth capacitor, the sixth capacitor, and the eighth capacitor is greater than the capacitance of the first capacitor, the third capacitor, the fifth capacitor, and the seventh capacitor.

14. The dynamic comparator according to claim 12, wherein the integrator further comprises:
a first AND gate, having two input terminals for respectively receiving the third clock signal and an enabling signal and an output terminal coupled to the control terminals of the sixth switch and the eighth switch; and
a second AND gate, having two input terminals for respectively receiving the second clock signal and the enabling signal and an output terminal coupled to the control terminals of the tenth switch and the twelfth switch.

15. The dynamic comparator according to claim 14, wherein the integrator further comprises:
a thirteenth switch, having a first terminal coupled to the second terminal of the sixth switch, a control terminal for receiving the enabling signal, and a second terminal coupled to the ground;
a fourteenth switch, having a first terminal coupled to the second terminal of the eighth switch, a control terminal for receiving the enabling signal, and a second terminal coupled to the ground;
a fifteenth switch, having a first terminal coupled to the second terminal of the tenth switch, a control terminal for receiving the enabling signal, and a second terminal coupled to the ground; and
a sixteenth switch, having a first terminal coupled to the second terminal of the twelfth switch, a control terminal for receiving the enabling signal, and a second terminal coupled to the ground.

16. The dynamic comparator according to claim 10 further comprising:
a clock generator, for receiving the fifth clock signal and generating the first clock signal, the second clock signal, the third clock signal, the fourth clock signal, the sixth clock signal, the seventh clock signal, and the eighth clock signal accordingly, the clock generator comprising:
a first inverter, having an input terminal for receiving the fifth clock signal and an output terminal for outputting the sixth clock signal;
a first delay inverter, having an input terminal for receiving the fifth clock signal and an output terminal for outputting the fourth clock signal;
a second delay inverter, having an input terminal for receiving the fourth clock signal and an output terminal for outputting the first clock signal;
a D flip-flop (FF), having a clock signal receiving terminal for receiving the fifth clock signal, a data receiving terminal and a first output terminal coupled with each other for outputting a ninth clock signal, and a second output terminal for outputting a tenth clock signal, wherein periods of the ninth clock signal and the tenth clock signal are twice of periods of the first clock signal, the fourth clock signal, the fifth clock signal, and the sixth clock signal, duty cycles of the ninth clock signal and the tenth clock signal are 50%, and a phase difference between the ninth clock signal and the tenth clock signal is 180°;

a first NOR gate, having two input terminals for respectively receiving the sixth clock signal and the tenth clock signal and an output terminal for outputting the eighth clock signal;

a second inverter, having an input terminal for receiving the eighth clock signal and an output terminal for outputting the second clock signal;

a second NOR gate, having two input terminals for respectively receiving the sixth clock signal and the ninth clock signal and an output terminal for outputting the seventh clock signal; and a third inverter, having an input terminal for receiving the seventh clock signal and an output terminal for outputting the third clock signal.

* * * * *